United States Patent
Lin et al.

(10) Patent No.: US 9,723,750 B2
(45) Date of Patent: Aug. 1, 2017

(54) ENSURING PROPER HEAT SINK INSTALLATION IN INFORMATION HANDLING SYSTEMS

(71) Applicant: DELL PRODUCTS L.P., Round Rock, TX (US)

(72) Inventors: Kuang Hsi Lin, TaouYuan County (TW); Hsu-Chu Wang, Taipei (TW); Chih Min Su, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 44 days.

(21) Appl. No.: 14/635,799

(22) Filed: Mar. 2, 2015

(65) Prior Publication Data

US 2016/0262285 A1 Sep. 8, 2016

(51) Int. Cl.
*H05K 7/20* (2006.01)
*G06F 1/20* (2006.01)
*H01L 23/40* (2006.01)

(52) U.S. Cl.
CPC ........... *H05K 7/20154* (2013.01); *G06F 1/20* (2013.01); *H01L 23/4006* (2013.01); *H01L 23/4093* (2013.01); *H05K 7/20409* (2013.01); *H05K 7/2049* (2013.01)

(58) Field of Classification Search
CPC ............... H05K 7/2039; H05K 7/2049; H05K 7/20154; H05K 7/20409; H01L 23/40–23/4093; G06F 1/20; G06F 1/203
USPC ........................... 361/709–710, 719, 679.54; 165/80.2–80.3; 257/718–719, 721–722
See application file for complete search history.

(56) References Cited

U.S. PATENT DOCUMENTS

| | | | | |
|---|---|---|---|---|
| 6,021,044 A * | 2/2000 | Neville, Jr. | ............... | G06F 1/20 165/104.33 |
| 6,180,874 B1 * | 1/2001 | Brezina | ............... | H01L 23/4093 165/80.3 |
| 6,639,800 B1 * | 10/2003 | Eyman | ............... | H01L 23/4006 165/185 |
| 6,763,881 B1 * | 7/2004 | Wagner | ............... | H01L 23/3736 165/121 |
| 2004/0095728 A1 * | 5/2004 | Bird | .................... | H01L 23/4006 361/704 |
| 2005/0219825 A1 * | 10/2005 | Campini | ................. | G06F 1/183 361/719 |

(Continued)

*Primary Examiner* — Zachary M Pape
*Assistant Examiner* — Amir Jalali
(74) *Attorney, Agent, or Firm* — Baker Botts L.L.P.

(57) ABSTRACT

Systems and apparatuses for ensuring proper heat sink installation in an information handling system are disclosed. The information handling system may include a first receiving mechanism configured to receive a first component and to be coupled with a first heat sink for cooling the first component. The information handling system may further include a second receiving mechanism configured to receive a second component and to be interchangeably coupled with one of the first heat sink and a second heat sink for cooling the second component. The information handling system may further include a bracket associated with the first receiving mechanism, the bracket having a key configured to allow the first receiving mechanism to be coupled with the first heat sink and to prevent the first receiving mechanism from being coupled with the second heat sink.

14 Claims, 6 Drawing Sheets

(56) References Cited

U.S. PATENT DOCUMENTS

| | | | | |
|---|---|---|---|---|
| 2006/0007652 A1* | 1/2006 | Yatskov | ............. | G06F 1/20 |
| | | | | 361/679.47 |
| 2006/0007660 A1* | 1/2006 | Yatskov | ............. | H01L 23/4006 |
| | | | | 361/709 |
| 2006/0146499 A1* | 7/2006 | Reents | ............. | H01L 23/4093 |
| | | | | 361/704 |
| 2008/0144289 A1* | 6/2008 | Desrosiers | ............. | G01R 1/0458 |
| | | | | 361/719 |
| 2010/0319883 A1* | 12/2010 | Facusse | ............. | H05K 7/20809 |
| | | | | 165/104.26 |
| 2011/0292608 A1* | 12/2011 | Tan | ............. | H01L 23/36 |
| | | | | 361/696 |
| 2013/0083483 A1* | 4/2013 | Wei | ............. | H01L 23/467 |
| | | | | 361/697 |
| 2013/0126145 A1* | 5/2013 | Glover | ............. | H01L 23/4093 |
| | | | | 165/185 |
| 2013/0294093 A1* | 11/2013 | Ahn | ............. | F21K 9/135 |
| | | | | 362/373 |
| 2014/0062227 A1* | 3/2014 | Lang | ............. | H02K 5/18 |
| | | | | 310/52 |
| 2015/0092354 A1* | 4/2015 | Kelty | ............. | H05K 7/20563 |
| | | | | 361/722 |
| 2015/0262907 A1* | 9/2015 | Degner | ............. | H05K 1/181 |
| | | | | 361/679.47 |

* cited by examiner

 …

ENSURING PROPER HEAT SINK INSTALLATION IN INFORMATION HANDLING SYSTEMS

BACKGROUND

Field of the Disclosure

This disclosure relates generally to information handling systems and more particularly to ensuring proper heat sink installation within information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may process, store, and communicate information and may include one or more computer systems, data storage systems, and networking systems.

Components within various information handling systems may expend power as the information handling systems process and store information. As the components expend power, the components may heat up. Installing heat sinks within the information handling systems and coupling the heat sinks to the components may facilitate cooling the components so that the information handling systems operate correctly.

SUMMARY

In one aspect, a disclosed information handling system may include a first receiving mechanism configured to receive a first component and to be coupled with a first heat sink for cooling the first component. The information handling system may further include a second receiving mechanism configured to receive a second component and to be interchangeably coupled with one of the first heat sink and a second heat sink for cooling the second component. The information handling system may further include a bracket associated with the first receiving mechanism, the bracket having a key configured to allow the first receiving mechanism to be coupled with the first heat sink and to prevent the first receiving mechanism from being coupled with the second heat sink.

In another disclosed aspect, an apparatus may include a circuit board having a plurality of components associated with an information handling system and a socket on the circuit board. The socket may provide a communicative connection to the plurality of components for a component seated in the socket. The apparatus may further include a first receiving mechanism associated with the socket configured to facilitate seating the component in the socket and a bracket coupled to the first receiving mechanism. The bracket may have a key configured to allow the first receiving mechanism to be coupled with a first heat sink and to prevent the first receiving mechanism from being coupled with a second heat sink.

In yet another disclosed aspect, a heat sink may have a thermal conductivity and may be configured to cool a component. The heat sink may include a plurality of fins to facilitate transferring heat from the component into a medium surrounding the heat sink. The heat sink may further include a fastener configured to couple the heat sink to a receiving mechanism and a cavity configured to accommodate a key of a bracket associated with the receiving mechanism. The cavity may allow the first heat sink to be coupled with the receiving mechanism while the key may be configured to prevent a different heat sink lacking the cavity from being coupled with the receiving mechanism.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a hyphenated form of a reference numeral refers to a specific instance of an element and the un-hyphenated form of the reference numeral refers to the element generically or collectively. Thus, as an example (not shown in the drawings), widget "12-1" refers to an instance of a widget class, which may be referred to collectively as widgets "12" and any one of which may be referred to generically as a widget "12". In the figures and the description, like numerals are intended to represent like elements.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a server, a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Particular embodiments are best understood by reference to FIGS. 1-5 wherein like numbers are used to indicate like and corresponding parts.

Figure 1:
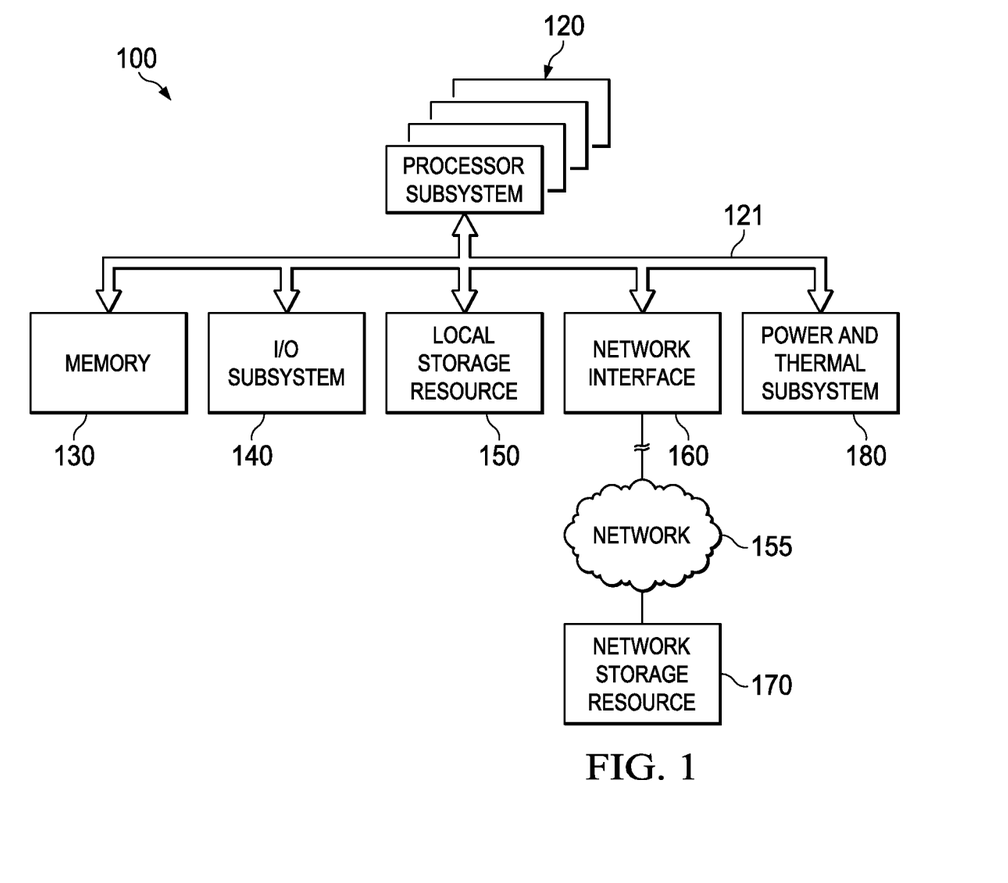
FIG. 1 is a block diagram of selected functional elements of an embodiment of an information handling system.

FIG. 1 illustrates a block diagram of selected elements of an embodiment of an information handling system 100. In certain embodiments, information handling system 100 may be configured to regulate its own airflow and/or to regulate airflow within another information handling system. Also shown with information handling system 100 are external or remote elements, namely, network 155 and network storage resource 170.

As shown in FIG. 1, components of information handling system 100 may include, but are not limited to, processor subsystem 120, which may comprise one or more processors, and system bus 121 that communicatively couples various system components to processor subsystem 120 including, for example, memory subsystem 130, I/O subsystem 140, local storage resource 150, network interface 160, and power and thermal subsystem 180. System bus 121 may represent a variety of suitable types of bus structures, such as a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI Express (PCIe) bus, HyperTransport (HT) bus, and Video Electronics Standards Association (VESA) local bus.

In FIG. 1, network interface 160 may be a suitable system, apparatus, or device operable to serve as an interface between information handling system 100 and a network 155. Network interface 160 may enable information handling system 100 to communicate over network 155 using a suitable transmission protocol and/or standard, including, but not limited to, transmission protocols and/or standards enumerated below with respect to the discussion of network 155. In some embodiments, network interface 160 may be communicatively coupled via network 155 to network storage resource 170. Network 155 may be implemented as, or may be a part of, a network attached storage (NAS), a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network 155 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 155 and its various components may be implemented using hardware, software, or any combination thereof. In certain embodiments, information handling system 100 and network 155 may be included in a rack domain.

As depicted in FIG. 1, processor subsystem 120 may comprise a system, device, or apparatus operable to interpret and/or execute program instructions and/or process data, and may include one or more microprocessors, microcontrollers, digital signal processors (DSPs), application specific integrated circuits (ASICs), or other digital or analog circuitry configured to interpret and/or execute program instructions and/or process data. In some embodiments, processor subsystem 120 may interpret and/or execute program instructions and/or process data stored locally (e.g., in memory subsystem 130). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as information handling system 100, is powered down.

In FIG. 1, local storage resource 150 may comprise computer-readable media (e.g., hard disk drive, solid state drive, floppy disk drive, CD-ROM, and/or other types of rotating storage media, flash memory, EEPROM, and/or other types of solid state storage media) and may be generally operable to store instructions and/or data. For example, local storage resource 150 may store executable code in the form of program files that may be loaded into memory subsystem 130 for execution. In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces.

As shown, information handling system 100 may also include a power and thermal subsystem 180. Power and thermal subsystem 180 may include one or more components such as power supplies, fans, heat sinks, etc., configured to provide power to other components within information handling system 100 and to ensure that thermal design constraints for the components are met (e.g., by cooling the components). Accordingly, certain components included within information handling system 100 (e.g., components within processor subsystem 120, memory 130, etc.) may operate by consuming power provided by power and thermal subsystem 180. In certain examples, designers of information handling system 100 may budget and account for power expected to be consumed by one or more of the components and may design power and thermal subsystem 180 to include an appropriate power supply configured to power the components. Additionally, the designers may design a cooling solution to ensure that components within information handling system 100 meet thermal design constraints. For example, the cooling system may employ fans to generate an airflow within information handling system 100 and dedicated heat sinks on certain components that consume large amounts of power (e.g., CPUs).

Figure 2:
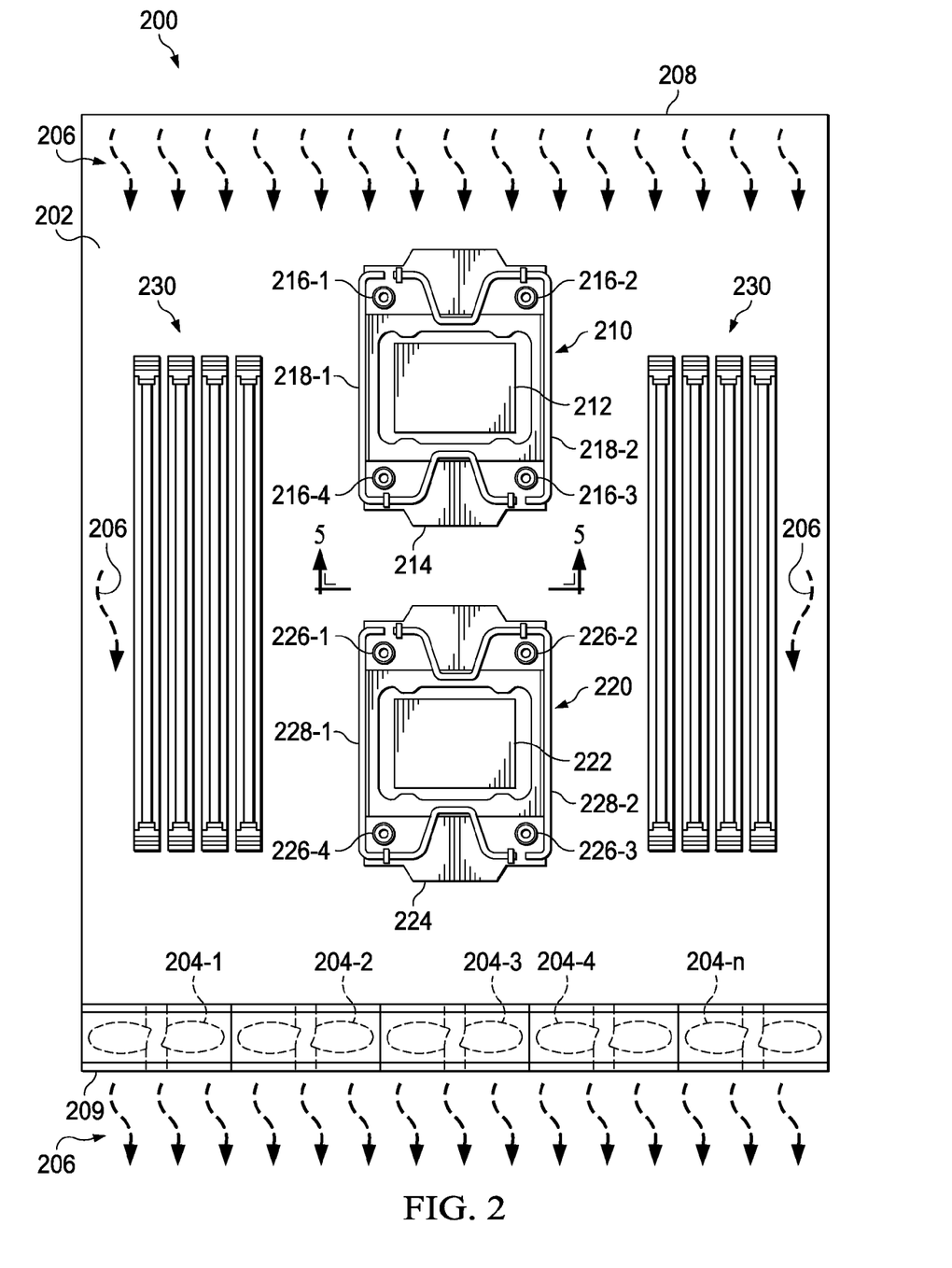
FIG. 2 is a block diagram of selected hardware elements of an embodiment of an information handling system.

FIG. 2 is a block diagram of selected hardware elements of an embodiment of an information handling system 200. FIG. 2 shows a component layout view of certain exemplary hardware components of information handling system 200. The components shown in FIG. 2 are not drawn to scale and information handling system 200 may contain additional or fewer components than the components shown in FIG. 2. Components of information handling system 200 may be interconnected with each other as well as with other components not shown in FIG. 2. For example, information handling system 200 may be interconnected with one or more other information handling systems. However, connections between components may be omitted in FIG. 2 for descriptive clarity. In FIG. 2, information handling system 200 may implement an embodiment of information handling system 100 described above with respect to FIG. 1.

As shown in FIG. 2, information handling system 200 may include circuit board 202. Although not shown in FIG. 2, circuit board 202 may be associated with one or more additional circuit boards or other components of information handling system 200 and/or may be associated with or enclosed within a chassis in any manner that suits a particular embodiment. Within information handling system 200, circuit board 202 may contain, support, or otherwise be associated with one or more hardware components. For example, circuit board 202 may support hardware components such as by providing conductive pads upon which the components may be soldered, and electrical connections to allow components soldered on circuit board 202 to communicate one with another.

Certain hardware components within information handling system 200 (e.g., components included on circuit board 202) may operate and consume power. As the components consume power, the components may increase in temperature and, if the increase in temperature is not restrained, may heat up until reaching a temperature at which the components or other components in proximity to them will fail or experience other undesirable consequences. Accordingly, the temperature of various components may be restrained by generating an airflow to carry heat away from the components and to expel the heat outside of information handling system 200.

For example, as shown in FIG. 2, one or more fans 204 (e.g., fans 204-1 through 204-n) may be configured to generate an airflow 206 for cooling information handling system 200. Airflow 206 may flow in any suitable direction. For example, fans 204 may suck air from an upstream end 208 of circuit board 202 toward a downstream end 209, as indicated by the direction of the arrows representing airflow 206. Relatively cool air may enter information handling system 200 at upstream end 208. The air may get progressively warmer as the air flows over circuit board 202 carrying away heat from various hardware components until the air is expelled by fans 204 at downstream end 209. In another example, fans 204 may be arranged near upstream end 208 and may blow air over circuit board 202 to generate airflow 206.

As shown, airflow 206 is illustrated by wavy arrows pointing toward downstream end 209 to represent fans 204 causing air to flow from upstream end 208 toward downstream end 209. Airflow 206 may remove heat from various components in proportion to respective surface areas of the components that are exposed to the airflow. For example, a component with a large surface area exposed to airflow 206 may more easily transfer heat to airflow 206 to be carried away and expelled than a component with a small surface area exposed to airflow 206. Accordingly, for certain components that generate large amounts of heat, it may be desirable to distribute heat generated by the components over larger surface areas exposed to airflow 206 to facilitate transferring heat to airflow 206 as efficiently as possible. For example, such components may make use of heat sinks.

A heat sink device may be thermally coupled to a heat-generating component to facilitate cooling the component. For example, a heat sink may be thermally coupled to the component using a gel, grease, adhesive, or other thermally conductive material to allow heat generated by the component to be efficiently transferred from the component into the material of the heat sink. The heat sink may be constructed from metal or another material having a high thermal conductivity to efficiently transfer heat from the component into a medium surrounding the heat sink (e.g., a fluid such as ambient air). The heat sink may also have a large surface area exposed to airflow passing by the component, for example by including a plurality of narrow fins or other features. Fins or other similar features (e.g., posts) may have a relatively large surface area exposed to airflow 206 and may thus provide an efficient means whereby heat may be transferred from the heat sink to the air. Accordingly, in operation, a heat sink thermally coupled to a component included on circuit board 202 may effectively increase the surface area of the component and facilitate the transfer of heat to airflow 206 so that the component may be more efficiently cooled by airflow 206.

The performance (e.g., effectiveness, efficiency, etc.) of a heat sink may be influenced by a thermal conductivity of the heat sink. For example, a high performance heat sink may have a large thermal conductivity. The thermal conductivity of a heat sink may result, at least in part, from the material of which the heat sink is constructed. For example, the high performance heat sink may be constructed of a highly thermally conductive material such as copper. As such, the high performance heat sink may perform very effectively in facilitating the transfer of large amounts of heat from a component to the air. However, because metals with high thermal conductivity such as copper may be relatively expensive, the effectiveness of the high performance heat sink may come at an increased monetary cost that may be absorbed into and reflected in the cost of information handling system 100.

Conversely, a low performance heat sink (e.g., a less effective and/or efficient heat sink) may have a smaller thermal conductivity than the high performance heat sink. For example, the low performance heat sink may be constructed of a material with a smaller thermal conductivity than copper such as aluminum. The low performance heat sink may perform less effectively than the high performance heat sink in that the low performance heat sink may facilitate the transfer of smaller amounts of heat from the component to the air as compared to the high performance heat sink. However, because materials with lower thermal conductivity such as aluminum may cost less than the materials with high thermal conductivity, the low performance heat sink may reduce monetary costs of information handling system 100 if the lower performance of the heat sink is suitable for meeting thermal design constraints of the components being cooled. In various examples, copper alloys, aluminum alloys, and/or other metals or thermally conductive materials may be used to construct heat sinks.

Hardware components on circuit board 202 may include any suitable components adapted to a particular embodiment of information handling system 200. For example, FIG. 2 shows prominent components such as an upstream component 212, a downstream component 222, and various dual in-line memory modules (DIMMs) 230 on circuit board 202. For example, upstream component 212 and downstream component 222 may include CPUs operating with DIMMs 230 according to principles of information handling systems described above in relation to FIG. 1. Although not explicitly shown in FIG. 2 for descriptive clarity, various other hardware components may also be included on circuit board 202. In certain examples, circuit board 202 may be very densely packed with components such that all or nearly all of circuit board 202 is utilized by components. In these examples, space on circuit board 202 may become scarce such that additional components may not be easily added to circuit board 202 because the additional components would not fit. In certain examples, a bottom side of circuit board 202 (not shown) may also include components.

Certain hardware components within information handling system 200 may be loadable and interchangeable. For example, as an alternative to directly soldering the hardware components to circuit board 202, various sockets or slots may be provided on circuit board 202 to allow the components to be dynamically loaded onto circuit board 202, removed, replaced, interchanged with other components, etc. For example, DIMMs 230 may each be seated in a DIMM slot (not expressly shown) and coupled to the DIMM slot using a locking mechanism the DIMM slot may provide. In other examples, chip-type components such as chips configured with ball grid array (BGA), pin grid array (PGA), land grid array (LGA), dual inline package (DIP), or other packaging types may also be adapted for use with a socket on circuit board 202. For example, upstream component 212 and downstream component 222 may be configured, respectively, to use sockets 210 and 220 included on circuit board 202.

As shown in FIG. 2, one or more component receiving mechanisms may be employed on circuit board 202 for receiving, aligning, retaining, and otherwise facilitating the coupling of components into sockets 210 and 220. For example, a receiving mechanism may include a retention device such as an independent loading mechanism (ILM) or similar device. Receiving mechanisms 214 and 224 may be associated with sockets 210 and 220 and may be used to facilitate proper seating of components 212 and 222 within sockets 210 and 220.

For example, upstream receiving mechanism 214 may be configured to seat upstream component 212 in a proper arrangement and/or orientation within upstream socket 210. Additionally, upstream receiving mechanism 214 may include locking mechanisms 218 (e.g., locking mechanisms 218-1 and 218-2) adapted to work together to lock upstream component 212 in place and apply a precise amount of pressure on upstream component 212 to ensure that electrical contacts on upstream component 212 are properly applied to corresponding electrical contacts on upstream socket 210 when upstream component 212 is seated within upstream socket 210. As shown, locking mechanism 218 may include lever arms that may be clamped down to lock upstream component 212 into place within upstream socket 210. Upstream receiving mechanism 214 may be coupled with upstream socket 210 and/or circuit board 202 in any suitable way known in the art.

Similarly, downstream receiving mechanism 224 may be configured to seat downstream component 222 in a proper arrangement and/or orientation within downstream socket 220. Additionally, downstream receiving mechanism 224 may include locking mechanisms 228 (e.g., locking mechanisms 228-1 and 228-2), which may be adapted work together to lock downstream component 222 in place and apply a precise amount of pressure on downstream component 222 to ensure that electrical contacts on downstream component 222 are properly applied to corresponding electrical contacts on downstream socket 220 when downstream component 222 is seated within downstream socket 220. As shown, locking mechanism 228 may include lever arms that may be clamped down to lock downstream component 222 into place within downstream socket 220. Downstream receiving mechanism 224 may be coupled with downstream socket 220 and/or circuit board 202 in any suitable way known in the art.

In addition to facilitating proper seating of components within sockets, receiving mechanisms may also facilitate proper coupling of heat sinks to components. For example, a heat sink may be configured to be installed on upstream and downstream receiving mechanisms 214 and/or 224 and may thus be coupled to components 212 and/or 222 within the respective sockets. For this purpose, receiving mechanisms 214 and/or 224 may include one or more attachment points to facilitate heat sink installation onto the receiving mechanism and support the heat sink such that the heat sink may be properly coupled to the component loaded in the receiving mechanism. For example, as shown in FIG. 2, upstream receiving mechanism 214 may include four attachment points 216 (e.g., 216-1 through 216-4). Similarly, downstream receiving mechanism 224 may include four attachment points 226 (e.g., 226-1 through 226-4). In some examples, each attachment point 216 and 226 may include a standoff. Each standoff may be coupled with the receiving mechanism and/or the circuit board at the attachment point. Each standoff may include a compression spring and/or a hollow shaft with internal threading to provide a means for coupling a heat sink with the receiving mechanism. For example, the heat sink may include an externally threaded bolt which may cooperate with the internal threading of the standoff to secure the heat sink to the standoff. In other examples, heat sinks may be coupled with receiving mechanisms using push pins (e.g., push pins with compression springs), clips (e.g., wire form z-clips), adhesives (e.g., thermally conductive tape or epoxy), etc. Installing a heat sink onto a receiving mechanism will be illustrated in reference to FIG. 5 below.

In certain embodiments, heat sinks may be coupled with (e.g., installed onto) both upstream receiving mechanism 214 and downstream receiving mechanism 224 to facilitate cooling upstream component 212 and downstream component 222, respectively. In some examples, low performance heat sinks and high performance heat sinks may be identical in shape, form, and appearance and may differ only in the material from which they are constructed. As such, low performance and high performance heat sinks may be adapted to couple interchangeably to upstream component 212 associated with upstream receiving mechanism 214 or downstream component 222 associated with downstream receiving mechanism 224.

In certain examples, the interchangeability of heat sinks may provide flexibility and increased ease of use to information handling system 200. For example, upstream receiving mechanism 214 may be associated with a low thermal conductivity threshold due to the proximity of upstream receiving mechanism 214 to fans 204 and the associated cooler temperature of airflow 206 near upstream end 208. As such, the thermal conductivity threshold may allow either a high performance or a low performance heat sink to be coupled with upstream receiving mechanism 214. The interchangeability may be problematic, however, for downstream receiving mechanism 224. Downstream receiving mechanism 224 may be associated with a higher thermal conductivity threshold due to the remoteness of downstream receiving mechanism 224 from fans 204. Thus, only a high performance heat sink having a thermal conductivity above the threshold may be able to satisfy the thermal constraints of downstream receiving mechanism 224.

The limitations on the interchangeability of heat sinks may arise because airflow 206 may not cool upstream component 212 and downstream component 222 with equal efficiency. Specifically, because airflow 206 gets progressively warmer as airflow 206 flows from fans 204 at upstream end 208 toward downstream end 209 where airflow 206 is expelled, downstream component 222 and the heat sink associated with downstream receiving mechanism 224 may be cooled by warmer air than upstream component 212 and the heat sink associated with upstream receiving mechanism 214. Accordingly, downstream component 222 might not be cooled as efficiently as upstream component 212. Furthermore, thermal design constraints relating to cooling downstream component 222 may be more restrictive than thermal design constraints relating to cooling upstream component 212. For example, thermal design constraints may designate that only a high performance heat sink (e.g., a heat sink substantially constructed of copper) may be used with downstream component 222, while allowing either the high performance heat sink or a low performance heat sink (e.g., a heat sink substantially constructed of aluminum) to be used with upstream component 212.

In certain examples, information handling system 200 may be impaired when thermal design constraints designating particular types of heat sinks are not followed. For example, if downstream component 222 is mistakenly coupled with a low performance heat sink rather than with a high performance heat sink as designated by the thermal design constraints, downstream component 222 may operate outside of its thermal specifications and may eventually suffer undesirable consequences up to and including operational failure and/or damage to downstream component 222 or other components. As another example, if upstream component 212 is mistakenly coupled with an expensive, high performance heat sink rather than a less expensive, low performance heat sink that is designated as being thermally sufficient, the total cost of information handling system 200 may rise unnecessarily.

While avoiding confusion and inadvertent installation of improper heat sinks may be important, it may be difficult to ensure that low performance and high performance heat sinks are not confused by users, technicians, service personnel, and other persons who may be tasked with installing the heat sinks on the receiving mechanisms. For example, when low performance and high performance heat sinks are similar or identical in shape, form, and appearance (e.g., differing only in material) and are adapted to couple interchangeably to various components associated with various receiving mechanism, persons tasked with installing the heat sinks may confuse one type of heat sink for another and install an improper heat sink on a receiving mechanism. Accordingly, certain information handling systems may include systems or apparatuses for ensuring that a heat sink designated as unacceptable for a particular receiving mechanism may not be installable when a person attempts to install the unacceptable heat sink on the receiving mechanism.

More specifically, an information handling system having an upstream and a downstream receiving mechanism configured to be coupled to respective heat sinks may employ a bracket to ensure that a heat sink designated as unacceptable for one of the receiving mechanisms will be prevented from being coupled with the receiving mechanism while heat sinks designated as acceptable will be allowed to be coupled with the receiving mechanism. For example, in certain embodiments of the information handling system, the downstream receiving mechanism may prevent the unacceptable heat sink and allow the acceptable heat sink to be coupled with the receiving mechanism while the upstream receiving mechanism may allow both heat sinks to be coupled to the receiving mechanism interchangeably. In operation, the bracket associated with the upstream receiving mechanism may have a key that only the acceptable heat sink is configured to accommodate. For example, the key may be a rigid post (e.g., a tab, bump, protuberance, etc.) and the acceptable heat sink may have a cavity (e.g., an opening, hole, void, indentation, depression, etc.) configured to accommodate the key, thus allowing the acceptable heat sink to be coupled with the receiving mechanism associated with the bracket. Meanwhile, the unacceptable heat sink may lack the cavity such that the key obstructs the unacceptable heat sink from coupling with the receiving mechanism.

Figure 3A:
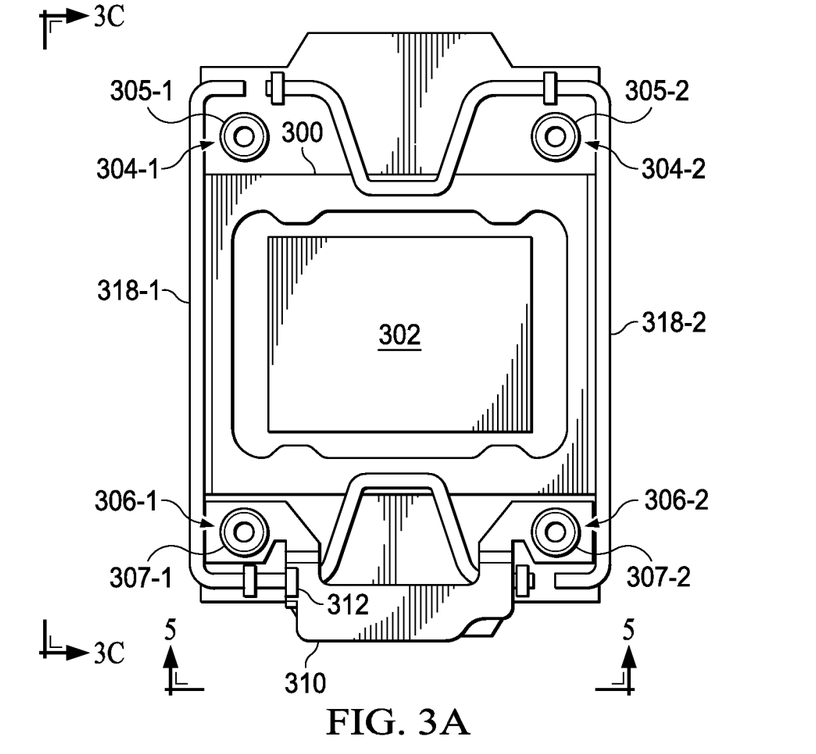
FIG. 3A is a top view of selected elements of an embodiment of a receiving mechanism within an information handling system.
Figure 3B:
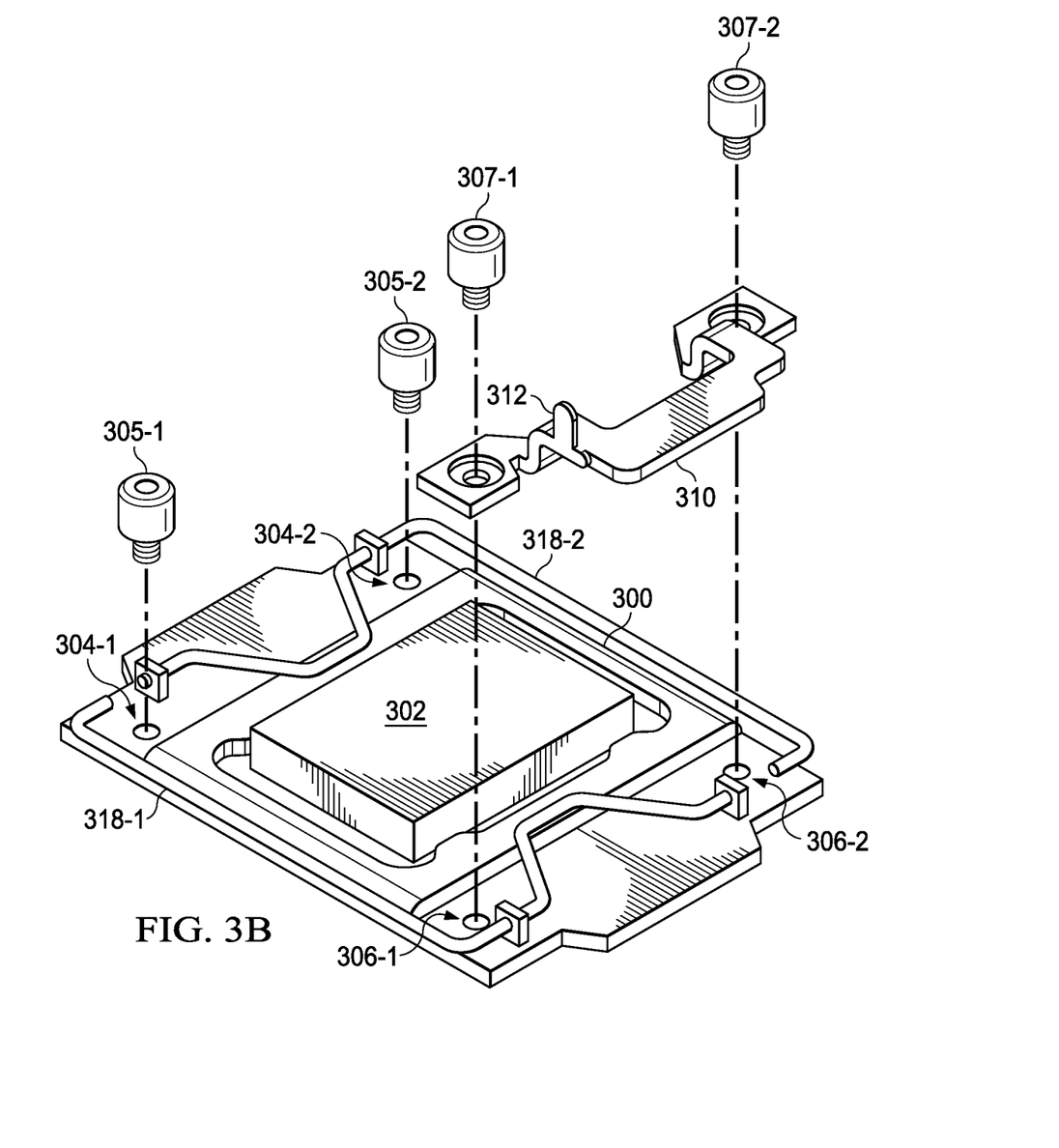
FIG. 3B is an exploded view of selected elements of an embodiment of a receiving mechanism within an information handling system.
Figure 3C:
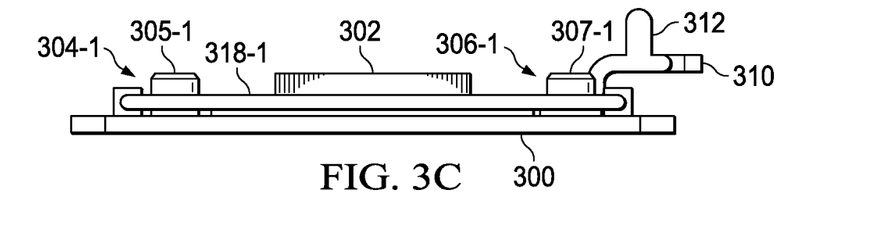
FIG. 3C is a side view of selected elements of an embodiment of a receiving mechanism within an information handling system.

To illustrate, FIG. 3 (e.g., FIGS. 3A, 3B, and 3C) show various views of selected elements of an embodiment of a receiving mechanism 300 within an information handling system such as information handling system 200. More specifically, FIG. 3A shows a top view of selected elements of receiving mechanism 300. Receiving mechanism 300 may be an embodiment of receiving mechanism 214 or receiving mechanism 224 described above in relation to FIG. 2. FIG. 3A is not drawn to scale and is for illustrative purposes only. Receiving mechanism 300 may include fewer or additional elements than the elements illustrated and described in relation to FIG. 3A. As shown in FIG. 3, receiving mechanism 300 may be associated with a component 302 which may be loaded into receiving mechanism 300. For example, component 302 may be properly seated within receiving mechanism and locked into place by locking mechanisms 318-1 and 318-2, as shown. Component 302 may be a CPU or other socket-loadable component as discussed in relation to upstream and downstream components 212 and 222 above (see FIG. 2). Receiving mechanism 300 may also include attachment points for facilitating installation of a heat sink onto receiving mechanism 300. As shown, attachment points 304 (e.g., 304-1 and 304-2) may include regular standoffs 305 (e.g., 305-1 and 305-2). Similarly, attachment points 306 (e.g., 306-1 and 306-2) may include shortened standoffs 307 (e.g., 307-1 and 307-2). Standoffs 305 and 307 may provide a means for installing a heat sink and properly securing the heat sink against a component, as discussed above in relation to attachment points 216 and 226 (see FIG. 2).

As shown, FIG. 3A may also include bracket 310 having a key 312. Bracket 310 may be installed onto receiving mechanism 300 to allow only certain heat sinks to couple to component 302 while obstructing others from doing so. For example, bracket 310 may allow one heat sink such as a high performance copper heat sink to be installed on receiving mechanism 300 and to be thermally coupled to component 302. However, bracket 310 may obstruct another heat sink such as a low performance aluminum heat sink from being installed on receiving mechanism 300 and/or from being thermally coupled to component 302. Accordingly, bracket 310 may ensure that if component 302 has a thermal design constraint designating, for example, only a high performance heat sink, a low performance heat sink that may not adequately cool component 302 may not be inadvertently installed. In another example, bracket 310 may allow a cheaper, low performance heat sink to be installed on receiving mechanism 300 and to be thermally coupled to component 302, but may obstruct a more costly high performance heat sink from doing so. Accordingly, bracket 310 may ensure that, if a thermal design constraint designates that both high performance and low performance heat sinks are adequate to cool component 302, a high performance heat sink that may be unnecessarily expensive may not be inadvertently used.

Bracket 310 may be robust and rigid to prevent heat sinks lacking a cavity configured to accommodate key 312 from coupling with receiving mechanism 300. Additionally, the robustness of bracket 310 may help avoid damage to the bracket when persons attempt to install heavy heat sinks lacking the cavity without using great care. Bracket 310 may support and/or be installable with any suitable receiving mechanism. For example, bracket 310 may be compatible with Intel ILMs or ILMs sold by other vendors. If a particular information handling system supports a different heat sink type, bracket 310 may be customizable. Bracket 310 may be configured to be easy to install on a receiving mechanism and/or to uninstall from the receiving mechanism when it is not desirable.

In operation, bracket 310 with key 312 may be installed onto receiving mechanism 300 so as to have a minimal impact on receiving mechanism 300 and/or other components in the vicinity of receiving mechanism 300. This may be important if, for example, bracket 310 is installed as a retrofit after receiving mechanism 300 and the circuit board to which receiving mechanism 300 is coupled have been designed and manufactured. In particular, in various embodiments, the circuit board to which receiving mechanism 300 is coupled may be crowded with many components, leaving little or no room to accommodate an extra component such as bracket 310. Accordingly, bracket 310 may be installed onto receiving mechanism 300 so as to not impact or interfere with receiving mechanism 300 (e.g., locking mechanisms 318), the operation of receiving mechanism 300, or any other aspect of the information handling system of which receiving mechanism 300 is a part such as cables, connectors, and other components in the vicinity of receiving mechanism 300. More specifically, even with bracket 310 installed on receiving mechanism 300, locking mechanisms 318 may be allowed to open and close without any interference from bracket 310. Receiving mechanism 300 may thus facilitate loading component 302 and otherwise operate as it would without bracket 310. Moreover, bracket 310 might not substantially impact the component layout of the information handling system, such as the placement of components on the circuit board in the vicinity of receiving mechanism 300. Bracket 310 may further be installed so as to have no substantial impact on the airflow around receiving mechanism 300 such as the airflow facilitating the cooling of component 302.

To further minimize the impact of bracket 310 on receiving mechanism 300, shortened standoffs 307 may be employed at attachment points 306 where bracket 310 is installed, while regular standoffs 305 may be employed at attachment points 304, which might not be associated with a bracket. To illustrate, FIG. 3B shows an exploded view of selected elements of the embodiment of receiving mechanism 300, as well as component 302. As shown, component 302 may be seated within receiving mechanism 300 and may be locked into place by locking mechanisms 318. As shown, regular standoffs 305-1 and 305-2 may be associated, respectively, with attachment points 304-1 and 304-2 to help attach receiving mechanism 300 to a circuit board. Similarly, shortened standoffs 307-1 and 307-2 may be associated, respectively, with attachment points 306-1 and 306-2 and to bracket 310 to couple bracket 310 with receiving mechanism 300 while further helping attach receiving mechanism 300 to the circuit board. Shortened standoffs 307 may be shorter than regular standoffs 305 by approximately the thickness of bracket 310. Accordingly, as shown, using shortened standoffs 307 on attachment points where bracket 310 is installed may facilitate securing bracket 310 to the attachment points while having a minimal impact on the installation of a heat sink that is to couple with receiving mechanism 300 using the standoffs.

To further illustrate, FIG. 3C shows a side view of selected elements of the embodiment of receiving mechanism 300, discussed in relation to FIGS. 3A and 3B. Like FIGS. 3A and 3B, FIG. 3C is not drawn to scale, and receiving mechanism 300 may include fewer or additional elements than the elements illustrated and described in relation to FIG. 3C. As shown in FIG. 3C, regular standoff 305-1 be employed at attachment point 304-1. The height of regular standoff 305-1 may have a particular relationship with the height of component 302 loaded into receiving mechanism 300. Because of the added thickness of bracket 310, shortened standoff 307-1 may be flush with the top of regular standoff 305-1 and may thus have the same particular relationship with the height of component 302 loaded into receiving mechanism 300.

While bracket 310 in FIG. 3 is installed onto receiving mechanism 300 at two attachment points 306, in certain embodiments, bracket 310 may be configured to attach at more or fewer attachment points of receiving mechanism 310, and regular and shortened standoffs may be employed accordingly. For example, a bracket may be designed to attach at only one attachment point of receiving mechanism 300. Thus one shortened standoff may be employed at the attachment point at which the bracket is installed and three regular standoffs may be employed at the other three attachment points of receiving mechanism 300. In another example, a bracket may be designed to attach at all four attachment points of receiving mechanism 300. In this example, shortened standoffs may be employed at all the attachment points of receiving mechanism 300 and no regular standoffs may be employed on receiving mechanism 300.

Bracket 310 may include one or more keys for obstructing an unsuitable heat sink (e.g., a low performance heat sink) from being installed on receiving mechanism 300 and/or being coupled to component 302, while allowing a suitable heat sink (e.g., a high performance heat sink) to be coupled with receiving mechanism 300 to cool component 302. In various embodiments, the one or more keys may take any suitable form that may obstruct the unacceptable heat sink from being installed unless the heat sink includes one or more corresponding cavities for accommodating the one or more keys. For example, a key may be a rigid post protruding from a bracket into a space reserved for a heat sink coupled to a component and a cavity to accommodate the key may be an opening on the heat sink configured to receive the rigid post when the heat sink is coupled with the receiving mechanism. FIGS. 3A and 3B illustrate this example. As shown, bracket 310 includes key 312, which may be a rigid tab protruding from bracket 310 into a space reserved for a heat sink coupled to component 302. As shown in FIG. 3B, because key 312 sticks up, key 312 may obstruct a heat sink from laying flat across component 302 and attachment points 304 and 306 unless the heat sink includes a cavity (e.g., an opening) to accommodate key 312.

In certain embodiments not shown, a plurality of keys may be used rather than single key 312. Additionally, in the same or other embodiments, key 312 may take a form other than the simple rigid tab shown in FIGS. 3A and 3B. For example, a key may have a certain shape that a corresponding feature on a heat sink may correlate to, a key may include a tab, bump, or other protrusion instead of a post, a key may include an opening configured to align with a protrusion feature present on a suitable heat sink, etc.

Figure 4A:
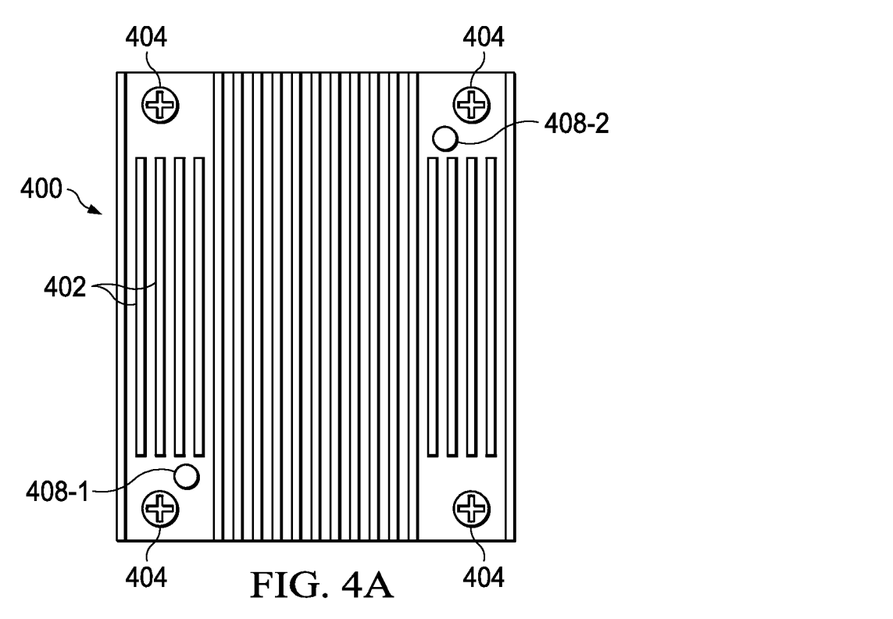
FIG. 4A is a top view of selected elements of a heat sink for use in an information handling system.

FIG. 4A is a top view of selected elements of a heat sink 400 for use in an information handling system. As shown, heat sink 400 may have a plurality of fins 402 to increase the surface area over which heat may be carried away from heat sink 400 by airflow passing heat sink 400. Heat sink 400 may also include bolts 404 to facilitate coupling heat sink 400 to a component that heat sink 400 is to cool. For example, as illustrated, bolts 404 may allow heat sink 400 to be coupled with a receiving mechanism such as receiving mechanism 300 by screwing bolts 404 into the standoffs at attachment points 304 and 306 (see FIG. 3). In other embodiments, heat sink 400 may employ additional and/or different types of fasteners in place of bolts 404. For example, as described above in relation to FIG. 2, a fastener configured to couple heat sink 400 to a receiving mechanism may include push pins (e.g., push pins with compression springs), clips (e.g., wire form z-clips), adhesives (e.g., thermally conductive tape or epoxy), etc. In yet other embodiments, heat sink 400 might not employ any mechanical fastener to facilitate installation of heat sink 400 onto the receiving mechanism. As shown, heat sink 400 also includes openings 408 (e.g., 408-1 and 408-2) for accommodating a key configured to ensure proper heat sink installation on a receiving mechanism. For example, if heat sink 400 is to be installed onto receiving mechanism 300 as shown in FIG. 3, one of openings 408 may align with and receive key 312 such that heat sink 400 may be installed onto receiving mechanism 300 and couple to component 302. Because heat sink 400 includes a cavity (e.g., openings 408) to accommodate a key, heat sink 400 may configured to be installed on any receiving mechanism in an information handling system employing the bracket for ensuring proper heat sink installation. For example, in information handling system 200, described above in relation to FIG. 2, heat sink 400 may be a high performance heat sink capable of suitably cooling either upstream component 212 or downstream component 222. As such, heat sink 400 may be installable on upstream receiving mechanism 214 or downstream receiving mechanism 224 regardless of any brackets that may be installed.

In certain embodiments, a heat sink may have a plurality of cavities to accommodate a key at a plurality of substantially symmetrical orientations by which the heat sink is adapted to couple to a component. For example, as shown in FIG. 4, heat sink 400 has two openings 408-1 and 408-2 even though only one key 312 may be present on receiving mechanism 300. This is because heat sink 400 may include two substantially symmetrical orientations or configurations by which heat sink 400 may suitably be coupled to a component and/or installed on a receiving mechanism. Specifically, if opening 408-1 is configured to accommodate (e.g., align with) key 312 when heat sink 400 is installed on receiving mechanism 300, heat sink 400 may be rotated 180 degrees about its center to a substantially symmetrical orientation wherein opening 408-2 may be configured to accommodate (e.g., align with) key 312. In other examples, a heat sink may include four substantially symmetrical orientations related by 90 degrees of rotation and may thus include four features (e.g., openings) to accommodate a key in each of the orientations. In yet other examples, a heat sink may include zero substantially symmetrical orientations (e.g., the heat sink may only be installed in one orientation) and may thus include only one feature to accommodate the key.

Figure 4B:
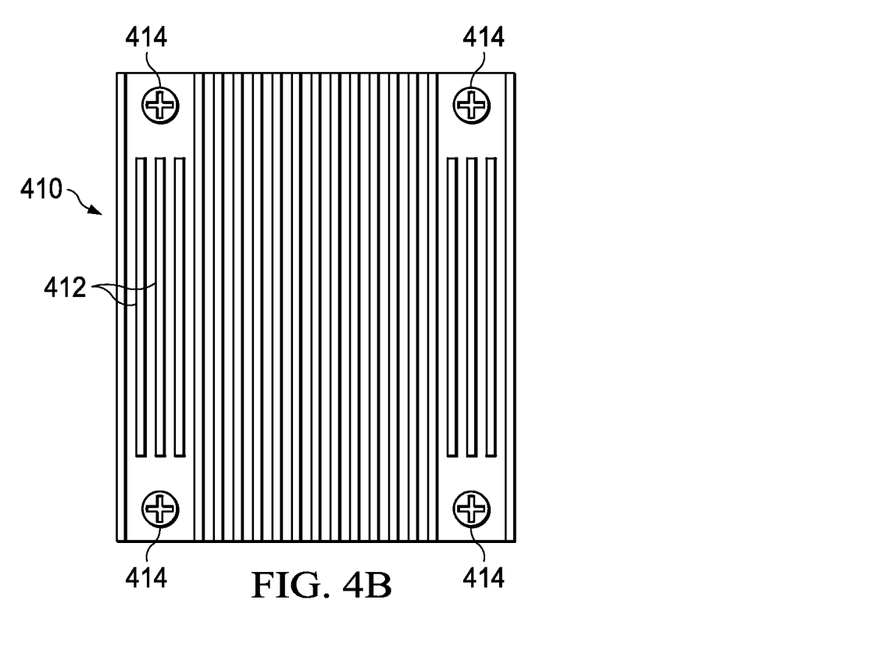
FIG. 4B is a top view of selected elements of a heat sink for use in an information handling system.

FIG. 4B is a top view of selected elements of a heat sink 410 for use in an information handling system. Heat sink 410 may be similar or identical to heat sink 400 of FIG. 4A in size, shape, and appearance. For example, like heat sink 400, heat sink 410 may have a plurality of fins 412 to increase the surface area over which heat may be carried away from heat sink 410 by airflow passing heat sink 410. Heat sink 410 may also include bolts 414 to be fastened to a component or a receiving mechanism associated with a component that heat sink 410 is to cool. However, unlike heat sink 400, heat sink 410 may not include corresponding cavities to accommodate a key like openings 408 on heat sink 400. Thus, if heat sink 410 is to be installed onto receiving mechanism 300 as shown in FIG. 3, no cavity of heat sink 410 may align with or receive key 312 and heat sink 410 may be obstructed by key 312 from being installed onto receiving mechanism 300 and/or coupling to component 302. Because heat sink 410 lacks a cavity to accommodate a key, heat sink 400 may configured to be installed only on particular receiving mechanisms in an information handling system employing a system for ensuring proper heat sink installation. For example, in information handling system 200, described above in relation to FIG. 2, heat sink 410 may be a low performance heat sink capable of suitably cooling only upstream component 212 but not downstream component 222. As such, heat sink 410 may be installable only on upstream receiving mechanism 214 if downstream receiving mechanism 224 is outfitted with a bracket having a key such as bracket 310.

Figure 5A:
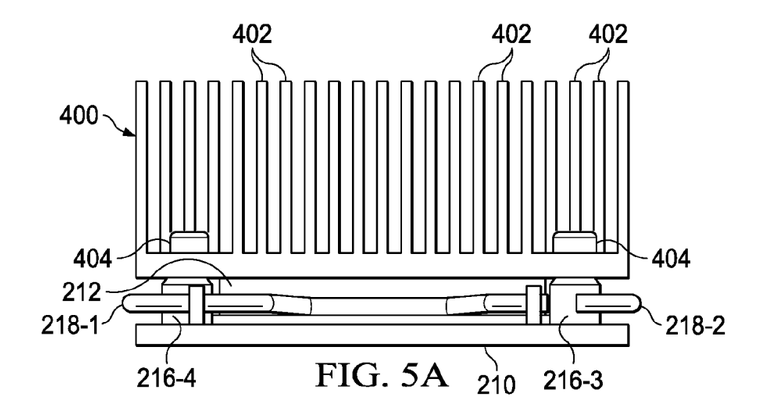
FIG. 5A is a front view of selected elements of a heat sink coupled to a component loaded into a receiving mechanism in an information handling system.
Figure 5B:
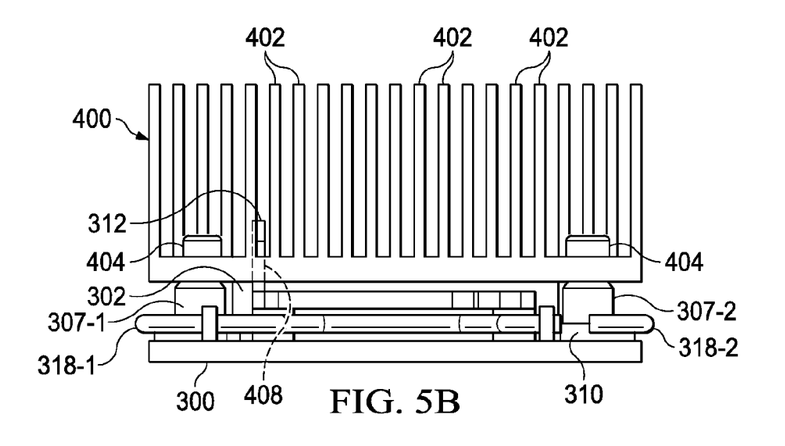
FIG. 5B is a front view of selected elements of a heat sink coupled to a component loaded into a receiving mechanism in an information handling system.
Figure 5C:
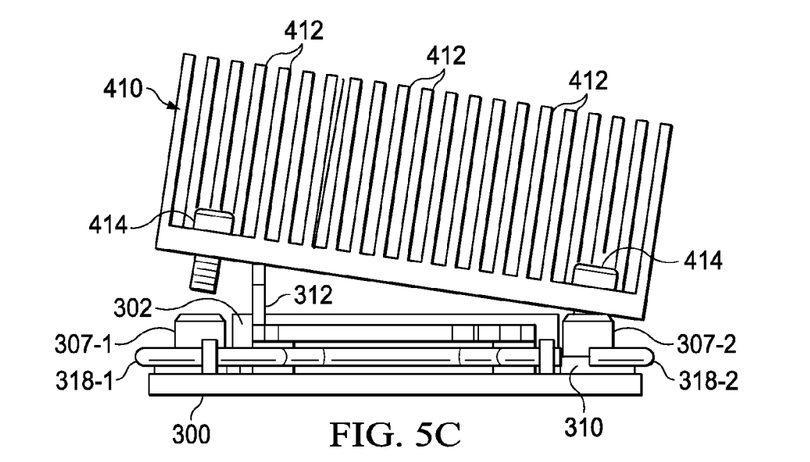
FIG. 5C is a front view of selected elements of a heat sink obstructed from coupling to a component loaded into a receiving mechanism in an information handling system.

FIG. 5 (e.g., FIGS. 5A through 5C) shows various front views of selected elements of various heat sinks coupled to, or being obstructed from coupling to, various components loaded into various receiving mechanisms in an information handling system. Specifically, FIG. 5A shows heat sink 400 discussed above in relation to FIG. 4A, being coupled to upstream component 212 associated with upstream receiving mechanism 214, as discussed above in relation to FIG. 2. As shown, heat sink 400 may be properly seated on upstream receiving mechanism 210 such that heat sink 400 may be coupled to upstream component 212 and may draw heat away from upstream component 212 to deliver the heat into airflow passing over and/or through fins 402 (e.g., airflow 206 in FIG. 2). Bolts 404 of heat sink 400 may be fastened to attachment points 216 of upstream receiving mechanism 210. For example, bolts 404 may screw into standoffs at attachment points 216-4 and 216-3, as shown.

Because heat sink 400 has openings 408 to accommodate a key, heat sink 400 may be configured to attach to any receiving mechanism regardless of whether a bracket is installed on the receiving mechanism. For example, heat sink 400 may be a high performance heat sink (e.g., constructed of copper) that may perform suitably when coupled to either upstream component 212 or to downstream component 222. Accordingly, as shown in FIG. 5A, heat sink 400 may successfully attach to receiving mechanism 214, which has no bracket installed, and openings 408 may not be used to accommodate a key because no key is present on receiving mechanism 214 to be accommodated.

In other examples, however, openings 408 may be used to accommodate a key and thereby allow heat sink 400 to also be successfully attached to a receiving mechanism that has a bracket installed. For example, FIG. 5B shows heat sink 400 being coupled to component 302, loaded into receiving mechanism 300 as discussed above in relation to FIG. 3. As shown, heat sink 400 may be properly seated on receiving mechanism 300 such that heat sink 400 may be coupled to component 302 and may draw heat away from component 302 to deliver the heat into airflow passing over and/or through fins 402. Bolts 404 of heat sink may be fastened to shortened standoffs 307 of receiving mechanism 300, such as to 307-1 and 307-2, as shown.

As discussed in relation to FIG. 3 and as shown in FIGS. 3 and 5, bracket 310 having key 312 may be installed onto receiving mechanism 300 so that only a heat sink having a cavity to accommodate key 312 may be coupled to component 302. For example, receiving mechanism 300 may implement a downstream receiving mechanism such as downstream receiving mechanism 224 (see FIG. 2), and may have thermal design constraints designating that only a high performance heat sink may suitably cool component 302. Specifically, a low performance heat sink (e.g., a heat sink constructed of aluminum) may not be configured to suitably cool component 302 when component 302 is positioned downstream from the source of the airflow cooling component 302 (e.g., downstream from fans 204 in FIG. 2). Accordingly, bracket 310 may be installed onto receiving mechanism 300 so that key 312 will obstruct low performance heat sinks from coupling with receiving mechanism 300 while allowing high performance heat sinks to be coupled with receiving mechanism 300 to cool component 302. As shown, opening 408 of heat sink 400 accommodates key 312 by allowing key 312 to go through opening 408. According to the orientation of heat sink 400, opening 408 shown in FIG. 5B may correspond to either opening 408-1 or opening 408-2 shown in FIG. 4A because heat sink 400 may have two substantially symmetrical orientations related by 180 degrees of rotation. In either substantially symmetrical orientation that heat sink 400 may be installed, opening 408 may allow heat sink 400 to be properly coupled with receiving mechanism 300 to cool component 302.

In contrast, FIG. 5C shows how key 312 may obstruct a heat sink lacking a feature to accommodate key 312 from being coupled with receiving mechanism 300 to cool component 302. As shown in FIG. 5C, an attempt may be made to couple heat sink 410, a heat sink lacking a feature to accommodate a key as shown in FIG. 4, with receiving mechanism 300 while bracket 310 is installed on receiving mechanism 300. Because heat sink 410 lacks any cavity to accommodate the key (e.g., because heat sink 410 may be a low performance heat sink), key 312 obstructs heat sink 410 from coupling with receiving mechanism 300 and/or from cooling component 302. Specifically, even if some of bolts 414 may be fastened to receiving mechanism 300 such as by screwing into shortened standoff 307-2 and/or by screwing into regular standoffs 305 (see FIG. 3A, not shown in FIG. 5C), no bolt 414 of heat sink 400 may be screwed into shortened standoff 307-1 because key 312 may not allow bolt 414 to even come into contact with shortened standoff 307-1, let alone be properly screwed into shortened standoff 307-1. Accordingly, while heat sink 400 may be coupled with receiving mechanism 300 while bracket 310 is installed due to opening 308, heat sink 410 lacks the cavity to accommodate key 312 and may therefore be obstructed from coupling with receiving mechanism 300 by key 312.

Systems and apparatuses for ensuring proper heat sink installation in an information handling system are disclosed. The information handling system may include a first receiving mechanism configured to receive a first component and to be coupled with a first heat sink for cooling the first component. The information handling system may further include a second receiving mechanism configured to receive a second component and to be interchangeably coupled with one of the first heat sink and a second heat sink for cooling the second component. The information handling system may further include a bracket associated with the first receiving mechanism, the bracket having a key configured to allow the first receiving mechanism to be coupled with the first heat sink and to prevent the first receiving mechanism from being coupled with the second heat sink.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An information handling system comprising:
    a first receiving mechanism configured to receive a first component and to be coupled with a first heat sink for cooling the first component, the first heat sink having a first thermal conductivity;
    a second receiving mechanism configured to receive a second component and to be interchangeably coupled with one of the first heat sink and a second heat sink for cooling the second component, the second heat sink having a second thermal conductivity different from the first thermal conductivity; and
    a bracket associated with the first receiving mechanism, the bracket having a key configured to allow the first receiving mechanism to be coupled with a heat sink having the first thermal conductivity and to prevent the first receiving mechanism from being coupled with a heat sink having the second thermal conductivity.

2. The information handling system of claim 1, wherein the first thermal conductivity is greater than the second thermal conductivity.

3. The information handling system of claim 1, wherein:
    the bracket having the key is installed on the first receiving mechanism to allow the first receiving mechanism to be coupled with the first heat sink and to prevent the first receiving mechanism from being coupled with the second heat sink;
    no bracket having a key is installed on the second receiving mechanism.

4. The information handling system of claim 2, wherein:
the bracket having the key is coupled to the first receiving mechanism;
the second thermal conductivity is below a thermal conductivity threshold associated with the first receiving mechanism.

5. The information handling system of claim 1, further comprising a fan configured to generate an airflow within the information handling system;
wherein the first receiving mechanism is arranged downstream from the second receiving mechanism in relation to a direction of the airflow.

6. The information handling system of claim 1, wherein the bracket is coupled to the first receiving mechanism exclusively at one or more attachment points of the first receiving mechanism by one or more shortened standoffs configured to secure the bracket at the one or more attachment points.

7. The information handling system of claim 1, wherein the key is a rigid post protruding from the bracket into a space reserved for the first heat sink.

8. An apparatus comprising:
a circuit board having a plurality of components associated with an information handling system;
a first socket on the circuit board, the first socket providing a communicative connection to the plurality of components for a component seated in the first socket;
a first receiving mechanism associated with the first socket, the first receiving mechanism configured to facilitate seating a component in the first socket;
a second receiving mechanism associated with a second socket, the second receiving mechanism configured to facilitate seating a component in the second socket and to be interchangeably coupled with one of a first heat sink having a first thermal conductivity and a second heat sink having a second thermal conductivity different from the first thermal conductivity; and
a bracket coupled to the first receiving mechanism, the bracket having a key configured to allow the first receiving mechanism to be coupled with the first heat sink and to prevent the first receiving mechanism from being coupled with the second heat sink.

9. The apparatus of claim 8, wherein the first thermal conductivity is greater than the second thermal conductivity.

10. The apparatus of claim 8, wherein:
no bracket having a key is coupled to the second receiving mechanism.

11. The apparatus of claim 9, wherein the second thermal conductivity is below a thermal conductivity threshold associated with the first receiving mechanism.

12. The apparatus of claim 8, wherein:
the circuit board further includes:
a second receiving mechanism configured to be interchangeably coupled with one of the first heat sink and the second heat sink; and
a fan configured to generate an airflow within the information handling system; and
the first receiving mechanism is arranged downstream from the second receiving mechanism in relation to a direction of the airflow.

13. The apparatus of claim 8, wherein the bracket is coupled to the first receiving mechanism exclusively at one or more attachment points of the first receiving mechanism by one or more shortened standoffs configured to secure the bracket at the one or more attachment points.

14. The apparatus of claim 8, wherein the key is a rigid post protruding from the bracket into a space reserved for the first heat sink.

* * * * *